United States Patent [19]

Routh

[11] 4,387,352

[45] Jun. 7, 1983

[54] TRANSDUCER ARRAY CROSSOVER NETWORK

[75] Inventor: Claude C. Routh, San Diego, Calif.

[73] Assignee: The United States of America as represented by the Secretary of the Navy, Washington, D.C.

[21] Appl. No.: 126,590

[22] Filed: Mar. 3, 1980

[51] Int. Cl.[3] ...................... H03H 7/01; H03H 9/125; H03H 7/38

[52] U.S. Cl. ...................................... 333/32; 333/175; 333/176; 333/186; 310/319

[58] Field of Search ................................ 333/141-149, 333/32, 175, 186-187, 176; 310/314-319

[56] References Cited

U.S. PATENT DOCUMENTS 3,457,370 7/1969 Boner ................................ 333/32 X 4,091,345 5/1978 Yano et al. ...................... 333/187 X

*Primary Examiner*—Marvin L. Nussbaum

*Attorney, Agent, or Firm*—Robert F. Beers; Ervin F. Johnston

[57] ABSTRACT

A crossover network is coupled to each transducer in an array of acoustic transducers, each transducer having a different frequency band, and all of the crossover networks being coupled in parallel to a single driving amplifier. Each crossover network includes a network inductance connected in parallel with a transducer capacitance to form a parallel LC circuit, the resonant frequency of such circuit being equal to the resonant frequency of a transducer RLC series circuit. The network inductance of each network is coupled to the amplifier in series with a driver inductance and a driver capacitance, which are respectively equal to the inductance and capacitance of the RLC series circuit of a transducer.

15 Claims, 6 Drawing Figures

$$\left. \begin{aligned} X_{c_m} &= X_{ep} \\ R_s &= R_{ep} \\ f &= f_r \end{aligned} \right|$$

TRANSDUCER ARRAY CROSSOVER NETWORK

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The invention disclosed and claimed herein pertains to the field of acoustic signal projection wherein acoustic transducers of different ranges are selectively operated to generate signals across a very wide spectrum. More particularly, the invention pertains to such field wherein a single amplifier is employed to drive all of the transducers in a transducer array. Even more particularly, the invention pertains to such field wherein a crossover network is coupled to a transducer to present a load of comparatively low impedance to the amplifier at frequencies within the operating range of the transducer, and to otherwise present a load of comparatively high impedance.

In order to achieve wide-spectrum acoustic signal projection by means of an array of transducers of comparatively narrow range, means must be provided for selecting a particular transducer to project signals in a particular frequency range. In the prior art, a separate amplifier is coupled to each transducer, and a low level crossover, or steering, network is employed to direct a signal of particular frequency to the amplifier of the transducer capable of generating the particular frequency. However, it has been determined that if the steering network could be eliminated, and if all of the transducers of the array were to be driven by a single amplifier, significant cost and operational advantages could be realized.

In the present invention, a system is provided whereby each transducer in an array of the above type is coupled through a crossover network to a single driving amplifier. The input of a crossover network presents a comparatively low impedance to the amplifier at frequencies within the range of the transducer to which it is coupled, and otherwise presents a comparatively high impedance. The crossover networks are coupled in parallel to a single amplifier. There is no need for the steering network of the prior art, since a transducer is prevented by its crossover network from making more than a negligible response to incoming signals which are not in its frequency range.

SUMMARY OF THE INVENTION

The present invention provides crossover network apparatus for matching an acoustic transducer in an array of transducers with a transducer input signal, each of the transducers having a frequency range, and the input impedance of each of the transducers comprising an equivalent parallel resistance and an equivalent parallel reactance. The network apparatus includes a selected reactive means coupled in parallel with each of the transducers to form transducer networks, each of the transducer networks having an input impedance which is equal to the parallel equivalent resistance of the transducer it includes, when the input signal has a particular frequency which lies in the frequency range of such transducer. The invention further includes driving means in each of the transducer networks for enabling each of the transducers to provide a substantially constant response across its frequency range.

If the electrical structure of each of the transducers comprises a first capacitive element in parallel with an RLC series branch, each of the RLC series branches comprising a resistive element, a first inductive element and a second capacitive element connected in series, each of the selected reactive means preferably comprises an inductor means for forming a parallel LC circuit with the first capacitive element of one of the transducers. The inductor means coupled to a particular transducer provides an inductance which is selected so that the transducer network of the particular transducer has an input impedance which is equal to the resistance of the resistive element of the RLC series branch of the particular transducer when the frequency of the input signal is at the resonant frequency of such RLC series branch.

In a preferred embodiment of the invention, each of the transducers has a frequency range which is on the order of one octave, the frequency ranges of the transducers are different, and are respectively selected so that the transducers of the array may be selectively operated to project acoustic signals over a continuous wide spectrum.

The present invention also provides a method for matching an input signal of selected frequency to a transducer in a transducer array having a selected frequency range. The method comprises the steps of determining the frequency at which the input impedance of the series RLC branch of each transducer is at a minimum; measuring the parallel equivalent resistance of the RLC branch of each transducer at its minimum impedance frequency; measuring the parallel equivalent reactance of each transducer at its minimum impedance frequency; coupling a selected inductance in parallel with each transducer to form parallel LC resonant circuits, the resonant frequencies of such circuits being the frequencies at which their respective input impedances are at a minimum; and coupling the input signal through a circuit which comprises one of the inductances connected in series with a driving means, a driving means being structured to provide one of the transducers with a substantially constant frequency response across its frequency range.

OBJECTS OF THE INVENTION

An important object of the invention is to substantially simplify the electrical network apparatus which is required to match a transducer input signal of a particular frequency to the transducer in an array of transducers which includes the input signal frequency in its operating range.

Another object is to eliminate the need for a steering network and all but one amplifier in a system which employs a number of transducers of different frequency ranges to provide a wide spectrum of frequency projection into a selected acoustic medium.

Another object is to increase the power factor in a system of the above type.

Another object is to provide smooth crossover in a system of the above type, as an input signal varies in frequency from the operating range of one of the transducers into an adjacent operating range of another transducer.

These and other objects of the invention will become more readily apparent from the ensuing specification when taken together with the drawings.

DETAILED DESCRIPTION OF THE PREFERRED EMBODIMENT

Figure 1:
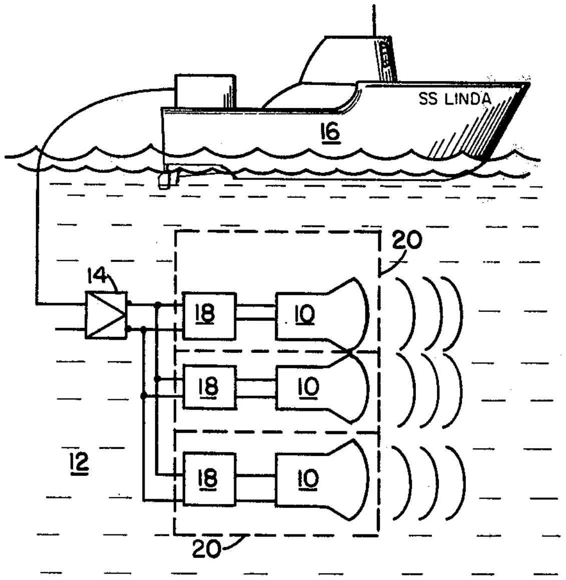
FIG. 1 is a perspective view showing a simplified employment of an embodiment of the invention.

Referring to FIG. 1, there is shown an array of transducers 10, such as piezo-electric transducers, deployed in an acoustic medium, such as water environment 12, to project acoustic signals thereinto. The operating frequency ranges of the piezo-electric transducers 10 are each on the order of one octave, but are different from one another. Transducers 10 are respectively selected so that they are together capable of projecting acoustic signals into environment 12 over a continuous wide spectrum.

In order to project an acoustic signal of a particular frequency into environment 12, a driving amplifier, such as a class B amplifier 14, is provided which receives an electrical input signal of the particular frequency from a control platform such as a vessel 16. The output of amplifier 14 therefore comprises a transducer driving signal of the particular frequency. In order to match the driving signal to the transducer of the array which includes the particular frequency in its range of operation, a crossover network 18, described hereinafter in greater detail, is coupled to each transducer 10 to form a transducer network 20, the transducer networks being coupled in parallel to the output of amplifier 14. The input impedance of a given transducer network 20 is very low, in comparison with the input impedance of each of the other transducer networks, when the frequency of the amplifier output signal lies within the operating range of the transducer of the given transducer network. On the other hand, when the amplifier output frequency is not within the operating range of the transducer of a given transducer network, the input impedance thereof is comparatively high. A transducer network of comparatively low impedance receives much more power than any of the other transducer networks, and therefore projects a dominating acoustic signal, of the aforementioned particular frequency.

In addition to the above advantage, by providing crossover networks 18 as hereinafter described, driving signals of varying frequency smoothly transit, or "crossover", between transducers of adjacent operating ranges.

Figure 2:
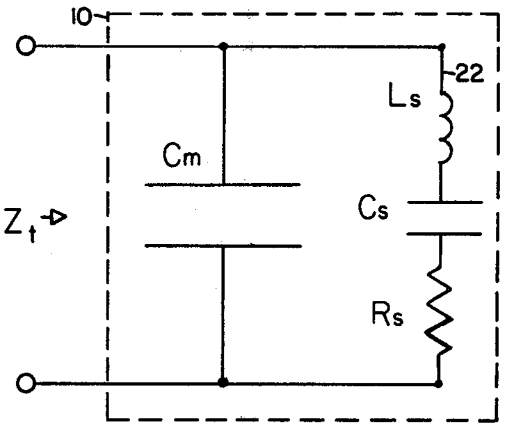
FIGS. 2–3 are schematic diagrams for illustrating the principle of the invention.

Referring to FIG. 2, there is shown the electrical structure of a transducer 10, such as a piezo-electric transducer, when it is projecting a signal into an acoustic medium 12. Capacitor $C_m$ represents a capacitance due to the lead-zirconate, or similar ceramic material, used in the transducer, and has a substantially constant value over the transducer frequency range. An RLC series branch 22, comprising the series interconnection of inductor $I_s$, capacitor $C_s$ and resistor $R_s$, represents the electrical effects of mechanical vibrations of the ceramic against medium 12 to create pressure waves. While the values of circuit elements $I_s$, $C_s$ and $R_s$ vary over the frequency range of the transducer, the impedance of RLC branch 22 is sufficiently high, in relation to the value of $C_m$, that is does not affect the total input impedance $Z_t$ of a transducer 10, except near the resonant frequency $f_r$ of a series RLC circuit which includes RLC branch 22.

Figure 3:
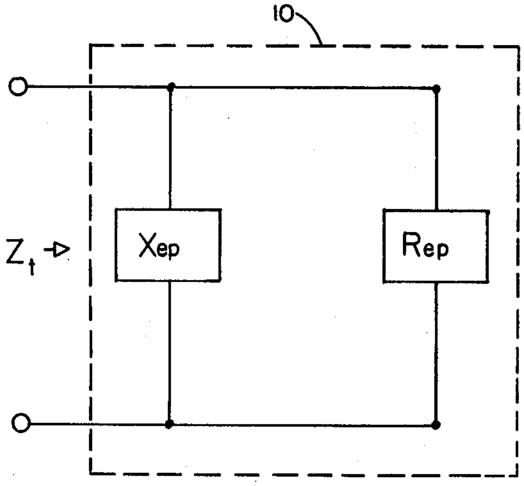

Referring to FIG. 3, there is shown the electrical structure of transducer 10 alternatively represented, in a well known manner, as an equivalent parallel resistance $R_{ep}$, connected in parallel relationship with an equivalent parallel reactance $X_{ep}$. It will be readily apparent that when the frequency of a signal coupled to transducer 10 is equal to $f_r$, the reactance of RLC branch 20 becomes O, so that $X_{ep}=C_m$, and $R_{ep}=R_s$. It follows that in order to determine the values of $C_m$ and $R_s$ for a particular transducer 10, the input impedance thereof is measured at various frequencies over its frequency range, to determine the frequency at which input impedance of the RLC branch is minimum. Since such minimum occurs at the resonant frequency $f_r$ of the RLC branch of the transducer, resonant frequency $f_r$ may be readily determined. Then, by coupling an input signal of frequency $f_r$ to transducer 10, and by measuring $R_{ep}$ and $X_{ep}$ according to standard procedures, $C_m$ and $R_s$ become known.

Figure 4:
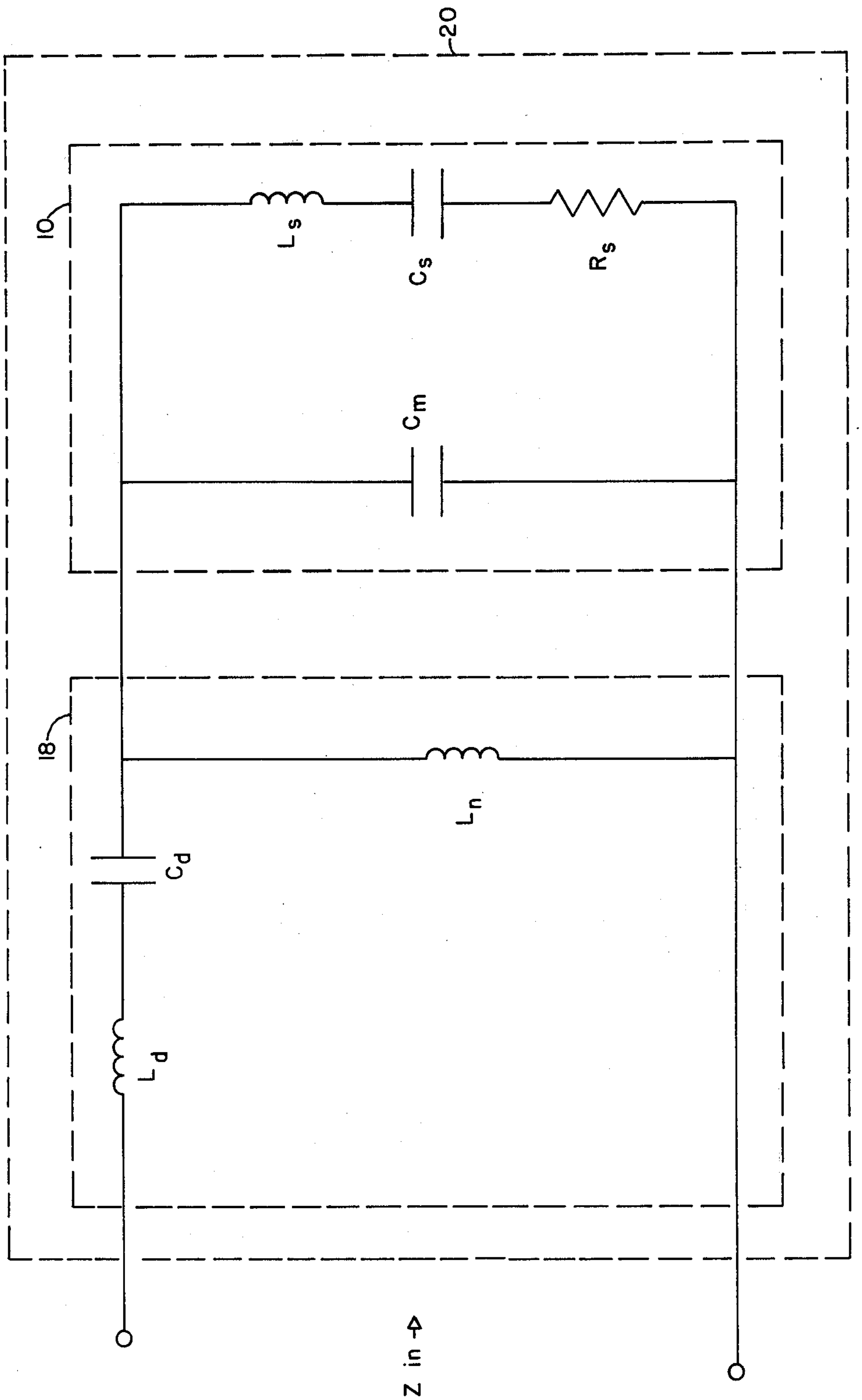
FIG. 4 is a schematic diagram showing a transducer network, including a transducer and a crossover network.

Referring to FIG. 4, there is shown a crossover network 18 coupled to a transducer 10, to form a transducer network 20 as aforementioned. The crossover network includes an inductor $L_n$, which is connected across transducer 10 to form a parallel LC circuit with capacitor $C_m$ of transducer 10. The inductance of inductor $L_n$ is selected so that the resonant frequency of the parallel LC circuit is $f_r$, the resonant frequency of RLC branch 22. Consequently, when the output of amplifier 14 comprises a signal having a frequency at or near $f_r$, the input impedance $Z_{in}$ of transducer network 20 is at a minimum, and resistive since that of the parallel circuit is so high it has a negligible effect on the input Z. The power received by a transducer network 20, for driving transducer 10 to project acoustic waves, is therefore at a maximum.

Referring further to FIG. 4, there is shown crossover network 18 further including a driving inductor $L_d$, and a driving capacitor $C_d$, connected in series between amplifier 14 and inductor $L_n$. It has been found that if $L_d=L_s$ and $C_d=C_s$, the driving power coupled to transducer 10 from amplifier 14 does not drastically fall off at the ends of the frequency range of transducer 10, whereby a fairly constant response is maintained thereacross. Also, by providing the above driving inductor and driving capacitor in each crossover network 18, a smooth cross-over, or transition, occurs in the operation of transducers having adjacent, or overlapping, operation ranges as the frequency of the transducer driving signal varies from the range of one of the transducers into the range of the other. At the cross-over point, one of the networks is inductive, while the other is capacitive, the inductance and capacitance cancelling out to provide purely resistive impedance.

Figure 5:
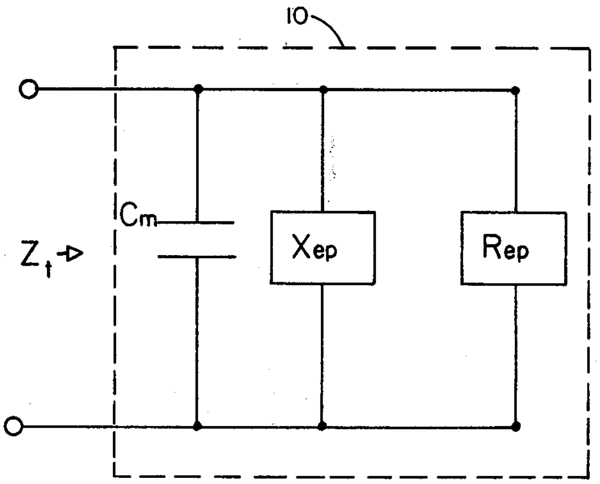
FIG. 5 is a further schematic diagram for illustrating the principle of the invention.

In order to determine the values of $L_s$ and $C_s$ of a transducer network, so that values of $L_d$ and $C_d$ may be selected therefor, FIG. 5 may be referred to, which shows a third representation of a transducer 10. Therein, capacitor $C_m$ is in parallel relationship with the parallel equivalent resistance $R'_{ep}$ and parallel equivalent reactance $X'_{ep}$ RLC series branch 22. It follows that $X_{ep}$, the aforementioned total parallel equivalent reactance of transducer 10, is equal to reactance $X_{cm}$ in parallel with reactance $X'_{ep}$. If K equals $f/f_{res}$, then it can be shown that:

$$X'_{ep} = \frac{X_{cm}}{\frac{X_{cm}}{X_{ep}} - K} \quad \text{(Eqn. 1)}$$

Also, if Q is the quality of the RLC branch of transducer 10, and $X_s$ is the series reactance of RLC branch RLC 22, then:

$$X_s = Q\, R_s \quad \text{(Eqn. 2)}$$

From the above equations, and from selected measurements of transducer 10, reactances and resistances, the values of $L_s$ and $C_s$, and therefore of $L_d$ and $C_d$, may be readily determined.

Figure 6:
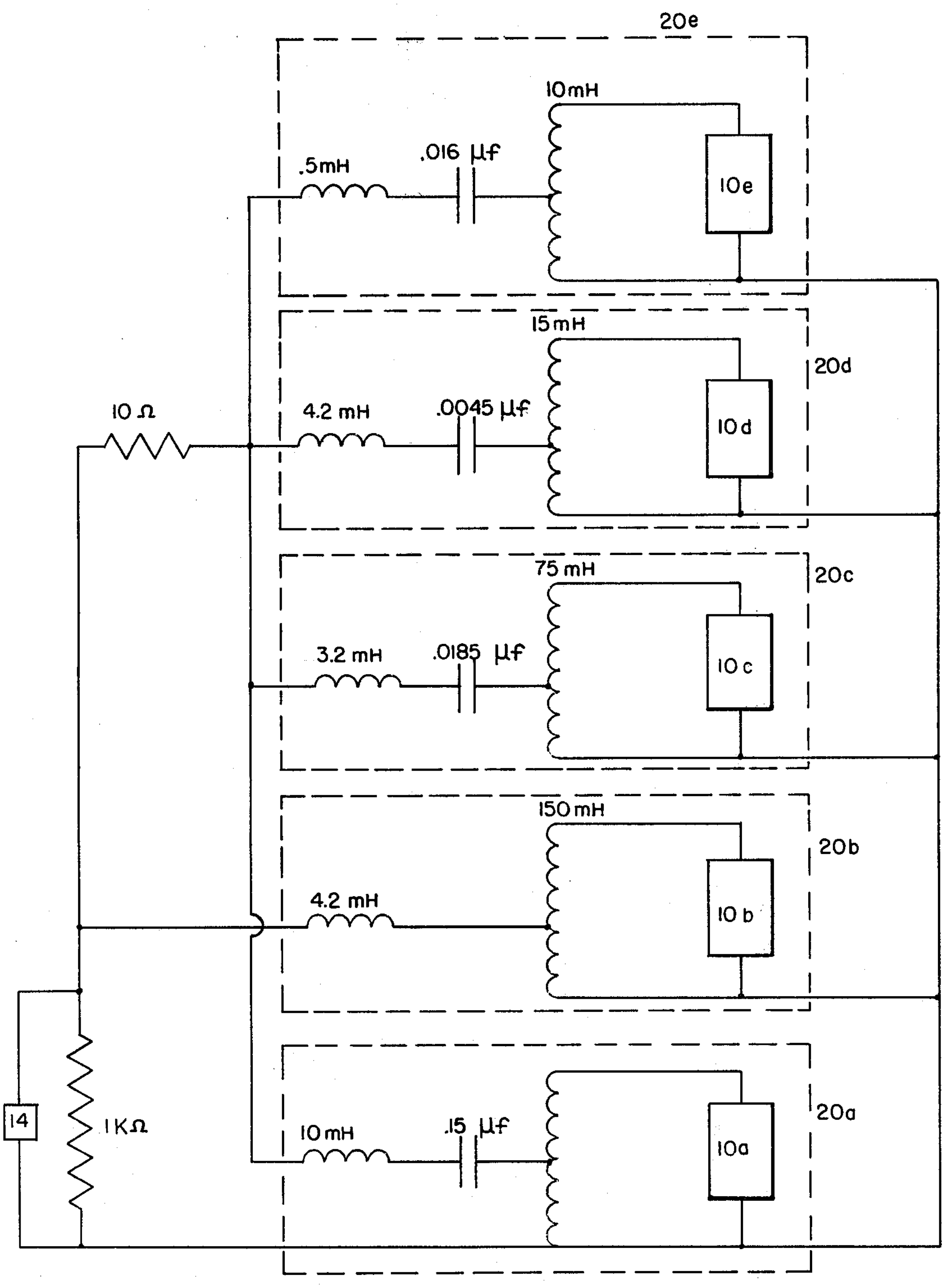
FIG. 6 is a schematic diagram showing an array of transducer networks coupled to form an embodiment of the invention.

Referring to FIG. 6, there is shown an array of transducers 10*a*–10*e*, each transducer coupled to a crossover network 18 to form transducer networks 20*a–e*, respectively. Transducer networks 20*a–e* are coupled in parallel to the output terminals of amplifier 14, across a 1 K ohm resistor. Respective values of $L_n$, $L_d$, and $C_d$ are shown for each crossover network, each inductor $L_n$ comprising one sixth of the turns of an autotransformer 24. FIG. 5 further shows transducer networks 20*a* and 20*c–e* coupled to amplifier 14 through a 10 ohm resistance, due to practical engineering considerations.

Obviously, many modifications and variations of the present invention are possible in the light of the above teachings, and, it is therefore understood that within the scope of the disclosed inventive concept, the invention may be practiced otherwise than as specifically described.

What is claimed is:

1. Electrical apparatus for combining with an acoustic transducer of selected frequency range to provide a transducer network having a comparatively low input impedance to signals of frequencies within the selected frequency range, and a comparatively high impedance to signals of frequencies outside the selected frequency range, said apparatus comprising:

first reactance means for forming a parallel LC circuit with a second reactance means, comprising a portion of the electrical structure of said transducer, the resonant frequency of said parallel LC circuit lying within said selected frequency range; and driving means coupled in series between said first reactance means and the source of said signals for providing said transducer with a substantially constant frequency response across said selected frequency range.

2. The apparatus of claim 1, wherein the electrical structure of said transducer comprises a transducer capacitance connected in parallel relationship with an RLC branch including resistive, inductive and capacitive elements connected in series, and wherein:

said first reactance means comprises a crossover network inductance connected in parallel relationship with said transducer capacitance to form said LC circuit, the resonant frequency of said LC circuit being equal to an RLC series circuit which includes said RLC branch; and said driving means comprises a driving inductor and a driving capacitor connected in series with said crossover network inductance for receiving said signals from a driving amplifier, and for increasing the power coupled to said transducer by said amplifier when one of said signals has a frequency which is located at one of the ends of said selected frequency range.

3. The apparatus of claim 2 wherein:

the inductance of said driving inductor is equal to the inductance of said inductive element of said RLC branch, and the capacitance of said driving capacitor is equal to the capacitance of said capacitive element of said RLC branch.

4. Crossover network apparatus for matching a particular transducer in a plurality of acoustic transducers with a transducer input signal having a frequency which lies within the operating frequency range of the particular transducer, said network apparatus comprising:

a network reactance means coupled in parallel relationship with each of said transducers for forming parallel resonant circuits, the resonant frequency of one of said parallel resonant circuits being equal to the resonant frequency of a series resonant circuit, each of said series resonant circuits including a series RLC branch which comprises a portion of the electrical structure of one of said transducers; and driving means for coupling each of said first reactance means to a single driving amplifier, and for enabling the responses of said transducers to remain substantially constant over their respective operating frequency ranges.

5. The network apparatus of claim 4 wherein the electrical structure of each of said transducers substantially comprises a transducer capacitance connected in parallel with one of said RLC series branches, each branch including a resistive, an inductive and a capacitive element, and wherein:

each of said first reactances comprises a network inductance means for forming an LC parallel resonant circuit with the transducer capacitance of one of said transducers, the parallel resonant circuit of a given one of said transducers having a resonant frequency which is equal to the resonant frequency of the series resonant circuit which includes the series RLC branch of said given transducer; and each of said driving means comprises a driving inductor and a driving capacitor connected in series with one of said network inductance means to form a crossover network which is coupled to one of said transducers, each of said crossover networks being coupled in parallel to the output of an amplifier receiving said input signal.

6. The network apparatus of claim 5 wherein:

the inductor and capacitor of a given one of said driving means have an inductance and a capacitance which are respectively equal to the inductance and the capacitance of the inductive and capacitive elements of the RLC series branch of the transducer to which the crossover network of said given driving means is coupled.

7. Crossover network apparatus for matching an acoustic transducer in an array of transducers with a transducer input signal, each of said transducers having a frequency range, and the input impedance of each of said transducers comprising an equivalent parallel resistance and an equivalent parallel reactance, said network apparatus comprising:

a selected reactive means coupled in parallel with each of said transducers for forming transducer networks, one of said transducer networks having an input impedance which is equal to the parallel equivalent resistance of a particular one of said transducers when said input signal has a particular frequency, said particular frequency lying in the frequency range of said particular transducer; and driving means are included in each of said transducer networks for enabling each of said transducers to provide a substantially constant response across its frequency range.

8. The apparatus of claim 7 wherein the electrical structure of each of said transducers comprises a first capacitive element in parallel with an RLC series branch, each of said RLC series branches comprising a resistive element, a first inductive element, and a second capacitive element connected in series, and wherein:

each of said selected reactive means comprises a first inductive means for forming a parallel LC circuit with the first capacitive element of one of said transducers, the first inductive means coupled to said particular transducer providing an inductance selected so that the transducer network of said particular transducer has an input impedance which is equal to the resistance of the resistive element of the RLC series branch of said particular transducer when the frequency of said input signal has said particular frequency.

9. The apparatus of claim 8 wherein:

each of said driving elements comprises a driving inductive element and a driving capacitive element connected in series to form a driving branch, each of said transducer networks comprising one of said driving branches connected in series with one of said first inductive means, each of said transducer networks being connected in parallel to a single power amplifier which receives said input signal.

10. The apparatus of claim 9 wherein each of said transducers has a frequency range which is on the order of one octave, the frequency ranges of said transducers being different and being respectively selected to enable the transducers of said array to project acoustic signals over a continuous wide spectrum, and wherein:

the first inductive means coupled in parallel to a given one of said transducers has an inductance selected so that the coupled first inductive means and the first capacitive element of said given transducer form a parallel LC circuit having a resonant frequency which is equal to the resonant frequency of an RLC series circuit which includes the RLC branch of said given transducer.

11. The apparatus of claim 10 wherein said transducers comprise piezoelectric transducers for enabling acoustic signal projection over a continuous spectrum, wherein:

the driving inductive and capacitive elements of a given one of said transducer networks have an inductance and capacitance which are respectively equal to the inductance and capacitance of the inductive and capacitive elements of the RLC branch of said given transducer network.

12. A method for matching an input signal to a transducer having a selected frequency range, said method comprising the steps of:

determining the frequency at which the input impedance of said transducer is at a minimum;

measuring the parallel equivalent resistance of said transducer at said minimum impedance frequency;

measuring the parallel equivalent reactance of said transducer at said minimum impedance frequency;

coupling a crossover network reactance element in parallel with said transducer to form a parallel resonant circuit with said measured reactance, the resonant frequency of said parallel resonant circuit being said minimum impedance frequency; and coupling said input signal through a circuit comprising said crossover network reactance element and a driving means connected in series, said driving means being structured to provide said transducer with a substantially constant frequency response across said selected frequency range.

13. The method of claim 12 wherein said step of coupling said crossover network reactance element comprises the step of:

coupling an inductive element in parallel with said transducer to form a parallel LC circuit, the resonant frequency of said parallel LC circuit being said minimum impedance frequency.

14. The method of claim 13 wherein said method includes the steps of:

determining the inductance of an inductive element and the capacitance of a capacitive element which are included in an RLC series branch comprising a portion of the electrical structure of said transducers; and coupling a driving inductor and a driving capacitor in series to form said driving means, the inductance of said inductor and the capacitance of said capacitor being respectively equal to the inductance and capacitance of said inductive and capacitive elements of said RLC series branch.

15. The method of claim 14 wherein:

said determining step comprises the step of determining the respective frequencies at which the input impedance of the RLC branch of each transducer in an array of transducers is at a minimum;

measuring the parallel equivalent resistance of each of said transducers at its minimum impedance frequency;

measuring the parallel equivalent reactance of each of said transducers at its minimum impedance frequency;

coupling an inductive element in parallel with each of said transducers to form parallel LC circuits, the resonant frequency of a given one of said LC circuits being the frequency at which the input impedance of the transducer of the given LC circuit is at a minimum;

connecting one of said driving means in series with each of said inductive elements to form crossover networks, one of said crossover networks being coupled to each of said transducers; and coupling each of said crossover networks in parallel to a single driving amplifier, which receives said input signal.

* * * * *